Aug. 23, 1960 E. T. JOHNSON 2,950,398

ELECTRICAL PULSE PRODUCING APPARATUS

Filed Feb. 6, 1958

INVENTOR.
ELMER T. JOHNSON
BY Henry L. Hanson
ATTORNEY

United States Patent Office 2,950,398

Patented Aug. 23, 1960

2,950,398

ELECTRICAL PULSE PRODUCING APPARATUS

Elmer T. Johnson, Wayland, Mass., assignor to Minneapolis-Honeywell Regulator Company, Minneapolis, Minn., a corporation of Delaware Filed Feb. 6, 1958, Ser. No. 713,630

8 Claims. (Cl. 307—88.5)

A general object of the present invention is to provide a new and improved electrical pulse producing apparatus. More specifically, the present invention is concerned with a new and improved electrical pulse producing apparatus incorporating a transistor functioning as the active element of the combination and connected in a blocking oscillator circuit configuration which is characterized by its ability to produce an accurate and controlled output pulse with optimum utilization of all of the associated circuit elements.

Electrical pulses are widely used for information representations in various types of electronic equipment. Frequently, the electrical pulses utilized in such equipment must be transferred and manipulated in numerous circuits in the course of a particular operation. The manipulating and transfer of electrical pulses by way of electrical components has generally resulted in the electrical pulses being distorted and otherwise modified from their desired state so that their usefulness is decreased. In order to minimize the difficulty encountered with pulse signals whose wave forms have deteriorated, it is frequently desirable to provide a pulse reshaping or regenerating circuit which is capable of being triggered into operation by a nonstandard type of signal and yet produce an output signal of uniform and constant dimension and character. Blocking oscillators of various types have been heretofore utilized for purposes of producing uniform output electrical pulses. However, the adaption of the transistor to the blocking oscillator has presented numerous problems, particularly in providing a circuit combination which is capable of utilizing the transistor to optimum advantage in the circuit.

It is accordingly a further more specific object of the present invention to provide a new and improved transistorized blocking oscillator circuit which is arranged so that optimum use is made of the transistor operating characteristics in the circuit.

In accordance with the teachings of the present invention, there has been provided a transistorized blocking oscillator circuit utilizing a delay line in a degenerative circuit connection where the delay line controls the time length of the output pulse and the output is substantially independent of any of the other circuit parameters. In order to optimize the use of the transistor in the blocking oscillator configuration, the present invention utilizes further switching and clamping means to prevent the transistor from being operated in a region where an appreciable time is required in order to recover control of the transistor and switch it between its operating and non-operating states. In addition, the present circuit has been arranged so that it can conveniently be used to introduce a time delay following the application of an input pulse and yet produce a standard and uniform output pulse.

The foregoing objects and features of novelty which characterize the invention as well as other objects of the invention are pointed out with particularity in the claims annexed to and forming a part of the present specification. For a better understanding of the invention, its advantages and specific objects attained with its use, reference should be had to the accompanying drawings and descriptive matter in which there is illustrated and described a preferred embodiment of the invention.

Figure 1:
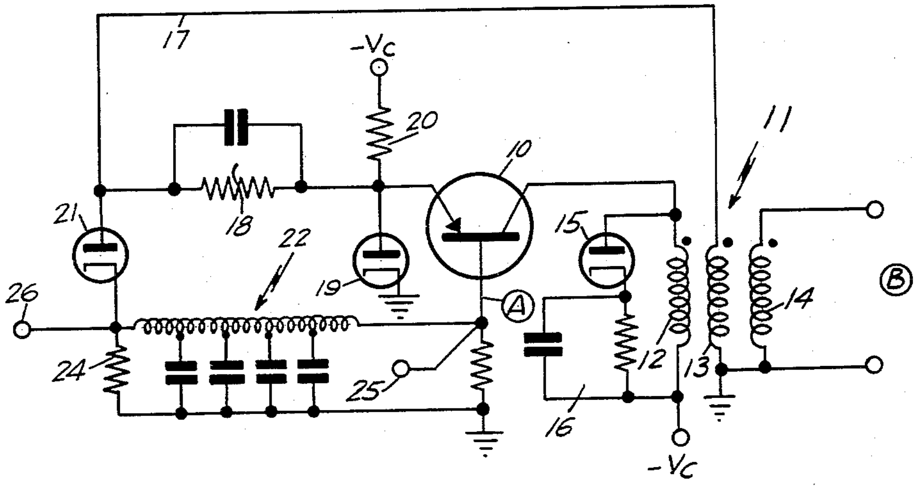
Figure 1 is a schematic showing of a preferred embodiment of the invention.

Referring first to Figure 1, the numeral 10 represents a transistor device having the usual base emitter and collector. Connected directly to the output of the transistor 10 at the collector is a transformer 11 having a primary 12, a secondary winding 13, and an output winding 14. Connected across the primary winding 12 is a series circuit comprising a diode 15 and an R-C network 16 comprising a resistor and a condenser connected in parallel.

The secondary winding 13 of the transformer 11 is both regeneratively and degeneratively coupled back to the input of the transistor 10. The regenerative coupling is by way of the feedback lead 17 and the R-C network 18, the latter comprising a parallel connected resistor and condenser. The R-C network 18 is directly coupled to the emitter of the transistor 10. Also coupled to the emitter of transistor 10 is a clamping diode 19 and a negative voltage source $-V_C$ connected to the emitter by way of a resistor 20. The diode 19 is preferably a silicon diode for the reason that this type of diode has a threshold of conduction which is slightly displaced from zero. This is useful in establishing the desired operating voltages for the transistor 10, as will be more fully discussed below.

The degenerative feedback connection is also by way of the feedback lead 17, a blocking diode 21, an LC delay line 22, and a delay line terminating resistor 23, the latter being connected at its upper terminal to the base of the transistor 10. A further resistor 24 is coupled to the other end of the delay line 22. Both of the resistors 23 and 24 are selected to be of the same magnitude as the characteristic impedance of the delay line 22. These terminating resistors 23 and 24 are required at both ends of the delay line 22 for the reason that the delay line has pulses thereon that may move bi-directionally depending upon the manner in which the input and output signals are applied thereto.

A pair of input terminals may be included in the circuit of Figure 1. A first terminal 25 is shown connected directly to the base of the transistor 10. This input terminal is used when it is desired that the input trigger pulse applied to the terminal 25 be reproduced and reshaped substantially in time coincidence on the output of the circuit. A further input terminal 26 may be used when it is desired to delay the output of the circuit by the time length of the delay line 22.

Considering now the over-all operation of the circuit of Figure 1, the circuit is first assumed in a quiescent or nonpulse producing state. Under these conditions, the transistor 10 will be nonconducting for the reason that the emitter of the transistor will be connected to the $-V_C$ voltage source by way of the resistor 20 and will be biased in the negative region. The base of the transistor 10 will be connected to ground so that the net bias on the base-emitter section of the transistor will maintain the transistor in a cut-off state. The circuit will remain in that condition until such time as an input trigger pulse is applied to one or the other of the input terminals.

It is assumed that the first input trigger pulse is one applied to the input terminal 25. The trigger pulse, in order to switch the circuit into operation, must be a negative trigger pulse. The presence of the negative signal on the terminal 25 will result in the negative signal being applied directly to the base of the transistor 10. The magnitude of this negative signal must be sufficient to overcome the negative bias voltage applied to the emitter, the latter bias voltage being determined by the relative magnitudes of the resistor 20 and the resistor in the R–C network 18. When the base of the transistor 10 is made more negative than the emitter, the transistor will begin to conduct and a current flow will pass through the transistor by a circuit that may be traced from the ground terminal of the secondary winding 13 through the lead 17, the R–C network 18, emitter-collector path of the transistor 10, and primary winding 12 to the $-V_C$ voltage source. The turns ratio of the primary 12 with respect to the primary 13 is preferably selected so that there will be a larger number of turns in the primary 12 than there is in the winding 13. Consequently it is possible to achieve a current gain in the secondary which current gain is effective regeneratively on the transistor 10 by way of the R–C network 18. It will be apparent that with the R–C network 18 present in the feedback circuit, that the initial rise of the wave form of the transistor will pass through the condenser of the R–C network directly to the emitter so that the transistor may be quickly switched into a conducting state.

Figure 2:
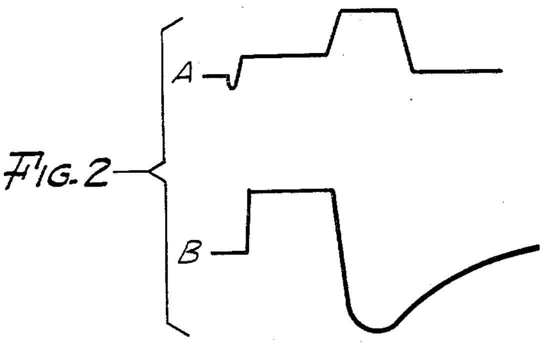
Figure 2 illustrates representative wave forms which may be observed in the circuitry of Figure 1 when the same is operative.

Referring to Figure 2, this initial operation of the apparatus as explained above is illustrated in Figure 2A where there is shown the wave form which may be observed at the base of the transistor 10. Initially, the transistor will be biased so that the base will be at substantially ground potential. The negative trigger pulse is then applied to the base immediately after which the transistor 10 switches to its conducting state. As soon as the transistor switches to the conducting state, the output wave form viewed in Figure 2B rises sharply and will remain at that level until the transistor is cut-off. As the regeneration is acting on the transistor 10, the current from the emitter will be dividing between the collector and base with the base current being determined by the transistor alpha. Thus, the current flowing in the base, while relatively small, is determined by the factor $1-\alpha$. Because of this current, the voltage on the base will raise above the ground potential due to the current flowing through the resistor 23.

At the same time that the regenerative signal is applied to the emitter by way of the R–C network 18, a degenerative signal will be decoupled through the diode 21 into the delay line 22. A resultant positive signal will be reflected through the delay line 22 to the terminating resistor 23 so that the positive voltage will be available to cut the transistor 10 off. The presence of the positive voltage and the cutting off of the transistor causes a quick reversal of the signal in the output as represented in Figure 2B. The output circuit will then recover by way of the damping network which includes the diode 15 and the R–C network 16.

Normally the regenerative signal on the emitter will not be large enough to overcome the threshold of the diode 19. However, when the degenerative signal is applied to the base, the emitter tends to go more positive in order to limit the positive voltage at the emitter, when the degenerative signal is applied to the base, the emitter is clamped. This clamping is effected by way of the diode 19 which is preferably a silicon diode having a threshold of conduction slightly displaced from zero voltage. Consequently, with such a diode present, the signal appearing on the emitter will be limited to a voltage that is slightly above zero as determined by the threshold of conduction of the silicon diode 19. This then permits a limiting of the back bias on the emitter so that the degenerative signal on the base can cut the transistor 10 off.

When the transistor 10 starts to switch off, the collapse of the field in the primary winding 12 will produce a feedback signal in winding 13 which is negative and is coupled directly to the emitter of transistor 10. This enhances the switching of speed of the transistor 10.

The diode 15 and R–C network 16 prevent the build-up of an excessively large negative voltage on the collector of transistor 10 when the transistor switches to cut off. The presence of the condenser in the network serves to absorb the peak negative voltage swing, otherwise present, and produce a wave having a negative swing as in Figure 2B.

Should it be desirable to provide a delay between the time that an input trigger pulse is applied to the circuit and the time that it appears at the output, this may be realized by applying the input negative trigger pulse to the terminal 26 on the input of the delay line 22. In this instance, it is desirable that the diode 21 also be a silicon diode to insure that the negative trigger pulse applied to the terminal 26 is not shunted to ground through the transformer secondary 13 unless the trigger voltage is greater than the threshold of the diode. With the negative trigger pulse appearing on the terminal 26, this pulse will be reflected through the delay line 22 to the base at which time the transistor 10 will be switched into a conducting state and the apparatus will function in the aforedescribed manner except that the output pulse as represented in Figure 2B will appear only after the time delay determined by the time constant of the delay line 22.

While, in accordance with the provisions of the statutes, there has been illustrated and described the best forms of the invention known, it will be apparent to those skilled in the art that changes may be made in the apparatus described without departing from the spirit of the invention as set forth in the appended claims and that in some cases, certain features of the invention may be used to advantage without a corresponding use of other features.

Having now described the invention, what is claimed as new and novel and which it is desired to secure by Letters Patent is:

1. A pulse producing circuit comprising a transistor device having input and output connections, an output transformer having a primary winding and a secondary winding, means connecting said primary winding in a series circuit with said output connections, first circuit means comprising a parallel connected resistor and condenser regeneratively connecting said secondary winding to said input connections, second circuit means comprising an electrical delay line degeneratively connecting said secondary winding to one of said input connections, and an input circuit connected to said input connections.

2. A transistor controlled blocking oscillator comprising a transistor having an emitter, base, and collector, a transformer having a primary winding and a secondary winding, means connecting said primary winding to said collector, a regenerative circuit connection from said secondary winding to said emitter, a resistor connected to said base, a degenerative circuit connection from said secondary winding to said resistor, said degenerative circuit connection comprising an inductive-capacitive delay line having said resistor as a terminating impedance therefor, and an input circuit connected to said base.

3. A pulse producing circuit comprising a transistor having a base, emitter, and collector, a transformer having a primary winding and a secondary winding, means connecting said primary winding to said collector, a resistor and condenser connected in parallel and connected between said secondary winding and said emitter, an electrical delay line, a diode coupling one end of said delay line to said secondary winding, and means connecting the other end of said delay line to said base.

4. A pulse producing circuit comprising a transistor having a base, emitter, and collector, a transformer having a primary winding and a secondary winding, means connecting said primary winding to said collector, a resistor and condenser connected in parallel and connected between said secondary winding and said emitter, a clamping diode connected to said emitter, an electrical delay line, a diode coupling one end of said delay line to said secondary winding, and means connecting the other end of said delay line to said base.

5. A circuit as defined in claim 4 wherein said clamping diode is a silicon diode having an appreciable threshold of conduction.

6. A pulse producing circuit comprising a transistor having a base, emitter, and collector, a transformer having a primary winding and a secondary winding, means connecting said primary winding to said collector, a resistor and condenser connected in parallel and connected between said secondary winding and said emitter, a silicon clamping diode connected to said emitter, an electrical delay line, a silicon diode coupling one end of said delay line to said secondary winding, means connecting the other end of said delay line to said base, and an input signal terminal connected to said one end of said delay line.

7. A pulse producing circuit comprising a transistor device having input and output connections, an output transformer having a primary winding and a secondary winding, means connecting said primary winding in a closed series circuit with said output connections, first circuit means regeneratively connecting said secondary winding to said input connections, second circuit means including a delay line degeneratively connecting said secondary winding to said input electrodes, an input circuit connected to said input connections, and a damping network coupled directly across said primary winding on said transformer, said damping network comprising a series circuit including a diode and a parallel connected resistor and condenser.

8. A pulse producing circuit comprising a transistor device having input and output connections a power source, means connected to said transistor to bias said transistor to be normally non-conducting, an output transformer having a primary winding and a secondary winding, means including said power source connecting said primary winding to said output connections, first circuit means regeneratively connecting said secondary winding to said input connections, a delay line having a terminating impedance connected to one terminal of said input connections, second circuit means comprising said electrical delay line degeneratively connecting said secondary winding to said one terminal of said input connections, and an input circuit connected to said input connections.

References Cited in the file of this patent

UNITED STATES PATENTS

| | | |
|---|---|---|
| 2,367,110 | Fayers | Jan. 9, 1945 |
| 2,426,021 | Hausz | Aug. 19, 1947 |
| 2,438,382 | Born | Mar. 23, 1948 |
| 2,663,766 | Meacham | Dec. 23, 1953 |
| 2,672,558 | Fischman | Mar. 16, 1954 |
| 2,683,806 | Moody | July 13, 1954 |
| 2,690,510 | Forbs | Sept. 24, 1954 |
| 2,697,166 | MacNichol et al. | Dec. 14, 1954 |